(12) United States Patent  
Seok (10) Patent No.: US 9,337,171 B2  
(45) Date of Patent: *May 10, 2016

(54) FULL BRIDGE RECTIFIER MODULE

(71) Applicant: IXYS Corporation, Milpitas, CA (US)

(72) Inventor: Kyoung Wook Seok, Milpitas, CA (US)

(73) Assignee: IXYS Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/670,423

(22) Filed: Mar. 27, 2015

(65) Prior Publication Data

US 2015/0200184 A1 Jul. 16, 2015

Related U.S. Application Data

(63) Continuation of application No. 13/931,599, filed on Jun. 28, 2013, now Pat. No. 9,041,075, which is a continuation of application No. 13/299,340, filed on Nov. 17, 2011, now Pat. No. 8,648,399.

(51) Int. Cl.
*H01L 27/06* (2006.01)
*H01L 25/065* (2006.01)
(Continued)

(52) U.S. Cl.
CPC ........ *H01L 25/0655* (2013.01); *H01L 23/3107* (2013.01); *H01L 23/49562* (2013.01); *H01L 23/49575* (2013.01); *H01L 23/5386* (2013.01); *H01L 23/645* (2013.01); *H01L 27/0647* (2013.01); *H01L 27/0761* (2013.01); *H02M 7/003* (2013.01); *H02M 7/04* (2013.01); *H01L 2224/48091* (2013.01);

(Continued)

(58) Field of Classification Search
CPC ........................... H01L 27/0647; H02M 7/003
USPC ................................... 257/275, 277, 477, 577
See application file for complete search history.

(56) References Cited

U.S. PATENT DOCUMENTS

| 4,398,206 A | 8/1983 | Neilson ......................... 257/577 |
| 4,424,557 A * | 1/1984 | Steigerwald ...... H02M 7/53871 307/46 |

(Continued)

OTHER PUBLICATIONS

B. Van Zeghbroeck, Principles of Electronic Devices, chapter 5.2 (2010).*

(Continued)

*Primary Examiner* — Thomas L Dickey
(74) *Attorney, Agent, or Firm* — Imperium Patent Works LLP; T. Lester Wallace; Amir V. Adibi (57) ABSTRACT

A full bridge rectifier includes four bipolar transistors, each of which has an associated parallel diode. A first pair of inductors provides inductive current splitting and thereby provides base current to/from one pair of the bipolar transistors so that the collector-to-emitter voltages of the bipolar transistors are low. A second pair of inductors similarly provides inductive current splitting to provide base current to/from the other pair of bipolar transistors. In one embodiment, all components are provided in a four terminal full bridge rectifier module. The module can be used as a drop-in replacement for a conventional four terminal full bridge diode rectifier. When current flows through the rectifier module, however, the voltage drop across the module is less than one volt. Due to the reduced low voltage drop, power loss in the rectifier module is reduced as compared to power loss in a conventional full bridge diode rectifier.

20 Claims, 11 Drawing Sheets

(51) Int. Cl.
*H01L 27/07* (2006.01)
*H01L 23/495* (2006.01)
*H01L 23/31* (2006.01)
*H01L 23/538* (2006.01)
*H01L 23/64* (2006.01)
*H02M 7/00* (2006.01)
*H02M 7/04* (2006.01)

(52) U.S. Cl.
CPC .............. *H01L 2224/48137* (2013.01); *H01L 2924/1305* (2013.01); *H01L 2924/13091* (2013.01); *H01L 2924/30107* (2013.01)

(56) References Cited

U.S. PATENT DOCUMENTS

| | | | |
|---|---|---|---|
| 6,430,071 B1 | 8/2002 | Haneda | 363/127 |
| 9,041,075 B2 * | 5/2015 | Seok | H01L 27/0647 257/277 |
| 2013/0128626 A1 | 5/2013 | Seok et al. | 363/21.14 |

OTHER PUBLICATIONS

Electronics Tutorials, "The Full Wave Rectifier", downloaded from http://www.electronics-tutorials.ws/diode/diode_6.html Aug. 27, 2014.*

* cited by examiner

AC-DC POWER SUPPLY CIRCUIT
(PRIOR ART)

INDUCTIVE CURRENT SPLITTING

INDUCTOR COMPONENT

FIG. 15

INDUCTOR COMPONENT

FIG. 16

MACHINE WOUND INDUCTOR
COMPONENT

FIG. 17

MACHINE WOUND INDUCTOR
COMPONENT

FIG. 18

FIRST EMBODIMENT
(PERSPECTIVE VIEW)

FIG. 19

FIRST EMBODIMENT
(TOP-DOWN VIEW)

FIG. 20

SECOND EMBODIMENT
(CROSS-SECTIONAL SIDE VIEW)

FIG. 21

THIRD EMBODIMENT
(TOP DOWN VIEW BEFORE ENCAPSULATION AND LEAD TRIMMING)

FIG. 22

PERSPECTIVE VIEW OF
A DUAL IN-LINE PACKAGE

FIG. 23

SINGLE IN-LINE PACKAGE
AND A HEAT SINK

FIG. 24

CROSS-SECTIONAL SIDE VIEW OF A
SINGLE IN-LINE PACKAGE

NPN TRANSISTOR AND DIODE CHIP

CIRCUIT OF FIGURE 28 AT THE
LEADFRAME STAGE OF MANUFACTURE

FIG. 29

FULL BRIDGE RECTIFIER MODULE

CROSS-REFERENCE TO RELATED APPLICATIONS

This application is a continuation of, and claims priority under 35 U.S.C. §120 from, nonprovisional U.S. patent application Ser. No. 13/931,599 entitled "Full Bridge Rectifier Module," filed on Jun. 28, 2013, now U.S. Pat. No. 9,041,075. U.S. patent application Ser. No. 13/931,599 is a continuation-in-part of, and claims the benefit under 35 U.S.C. §120 from, nonprovisional U.S. patent application Ser. No. 13/299,340, entitled "Bipolar Junction Transistor For Current Driven Synchronous Rectifier," filed on Nov. 17, 2011, now U.S. Pat. No. 8,648,399. The subject matter of each of the foregoing documents is incorporated herein by reference.

TECHNICAL FIELD

The described embodiments relate to rectifiers.

BACKGROUND INFORMATION

Figure 1:
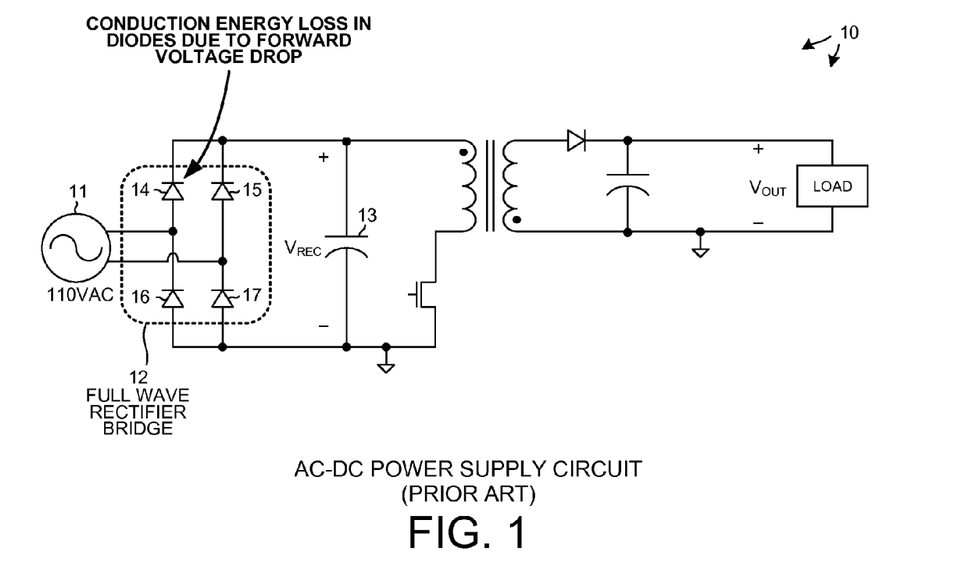
FIG. 1 (Prior Art) is a simplified diagram that shows an AC-to-DC converter power supply circuit 10.

FIG. 1 (Prior Art) is a simplified diagram of an AC-to-DC converter power supply circuit 10. More specifically, the AC-to-DC converter 10 is a flyback power supply. As is in the case with many AC-to-DC power supply circuits, an incoming AC supply voltage (for example, 110 VAC) from an AC voltage source 11 is rectified by a full wave bridge rectifier 12 so that an input capacitor 13 is charged. Incoming current flows into the rectifier, flows through one of the upper two diodes 14 and 15, flows into the remainder of the power supply circuit, and flows back from the remainder of the power supply circuit, and flows through one of the lower two diodes 16 and 17, and back to the voltage source 11. Which of the diodes the input current flows through depends on whether the phase of the incoming AC supply voltage is a positive voltage phase or a negative voltage phase. During most of the time during a sinusoidal cycle of an incoming 110 VAC supply voltage there is adequate current flowing through two diodes of the rectifier that the forward voltage drop across the diodes is about 1.0 volts apiece. There is conduction energy loss in these diodes. For a 200 watt power supply that receives 110 VAC, the average current flow through the rectifier is about two amperes. The resulting power loss in the rectifier is about four watts, because power loss is equal to the voltage drop multiplied by the current flow, because there is an average two volts of voltage drop across the diodes, and because there is an average input current of two amperes flowing.

SUMMARY

A full bridge rectifier circuit includes four bipolar transistors. Two of the bipolar transistors form a first pair of bipolar transistors and the other two bipolar transistors form a second pair of bipolar transistors. Each of the four bipolar transistors has an associated parallel diode. A first pair of inductors provides inductive current splitting and thereby provides base current to/from the first pair of bipolar transistors. A second pair of inductors similarly provides inductive current splitting to provide base current to/from the second pair of bipolar transistors. Providing the base current to/from the base of a bipolar transistor causes the collector-to-emitter voltage of the bipolar transistor to be low (if there is adequate current flowing through the bipolar transistor). The four bipolar transistors serve rectifying functions like the four diodes of a conventional full bridge diode rectifier.

In one embodiment, all components including the bipolar transistors, the diodes, and the inductors are provided in a four-terminal full bridge rectifier module. The module can be used as a drop-in replacement for a conventional four terminal full bridge diode rectifier. When current flows through the novel rectifier module, however, the total voltage drop across the module is less than one volt. Due to the reduced voltage drop, power loss in the novel rectifier module is reduced as compared to power loss in a similarly used conventional full bridge diode rectifier. In one example of this embodiment, the module is an inexpensive leadframe injection-molded packaged device that has four in-line package terminals. Four bipolar transistor/diode dice are die attached to the leadframe metal inside the package. Two inductor components (each of which includes two inductors) are also surface mounted to the leadframe metal inside the package. The transistor, diode, and inductor components are all overmolded with plastic encapsulant.

In another embodiment, a low forward voltage full bridge rectifier circuit is packaged separately from the inductors. The four bipolar transistors and their parallel diodes are provided in a six-terminal package. To use the packaged device as a full bridge rectifier, the two pairs of current splitting inductors are provided outside the packaged device.

Several circuit implementations and other embodiments are disclosed in the detailed description. Numerous ways of realizing the current-splitting inductors are also disclosed in the detailed description. Further details, embodiments, methods and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to background examples and some embodiments of the invention, examples of which are illustrated in the accompanying drawings.

Figure 2:
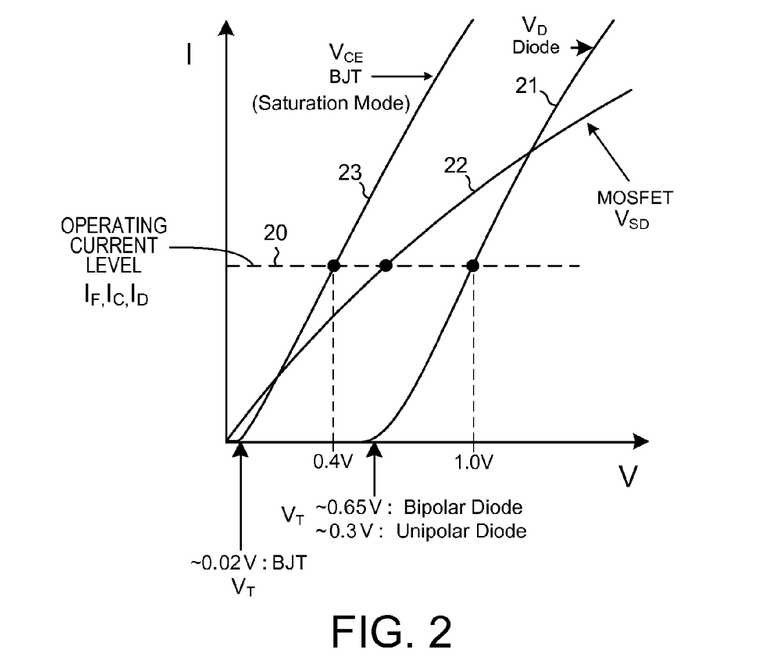
FIG. 2 is a diagram that shows the forward voltage voltage-to-current characteristics of a metal oxide semiconductor field effect transistor (MOSFET), a diode, and a bipolar junction transistor (BJT).

FIG. 2 is a diagram that shows the forward voltage voltage-to-current characteristics of a metal oxide semiconductor field effect transistor (MOSFET), a diode, and a bipolar junction transistor (BJT). Dashed line 20 represents an operating current that is of appropriate magnitude for the average current flow through the diodes of an input full wave rectifier of a 200 watt AC-to-DC flyback power supply. In the case of the diode whose characteristic is represented by line 21, the forward voltage drop across the diode is about 1.0 volts at the operating current. In the case of a MOSFET whose characteristic is represented by line 22, the $V_{DS}$ voltage drop across the MOSFET is about 0.6 volts. In the case of a bipolar transistor whose characteristic is represented by line 23, the $V_{CE}$ drop across the BJT is about 0.4 volts. In accordance with one novel aspect, a BJT is employed in the place of a diode in a full wave rectifier on the input of a power supply in order to reduce the forward voltage drop across the rectifier, and thereby to decrease power loss in the rectifier. By reducing the forward voltage drop across each rectifier in the full bridge rectifier, the average voltage drop in the rectifier can be reduced to about 0.8 volts. In the case of a 200 watt power supply that draws an average of about two amperes from the voltage supply, the average power loss in the rectifier can be reduced from about four watts (if a diode full wave rectifier is used) to less than two watts. The power loss is roughly given by the average current flowing of two amperes, multiplied by the average voltage drop across the rectifiers. The average voltage drop across BJT rectifiers is about 0.8 volts, so the average power loss is about 1.6 watts, which is substantially less than the 4.0 watts of power loss with a conventional diode full wave rectifier.

Figure 3:
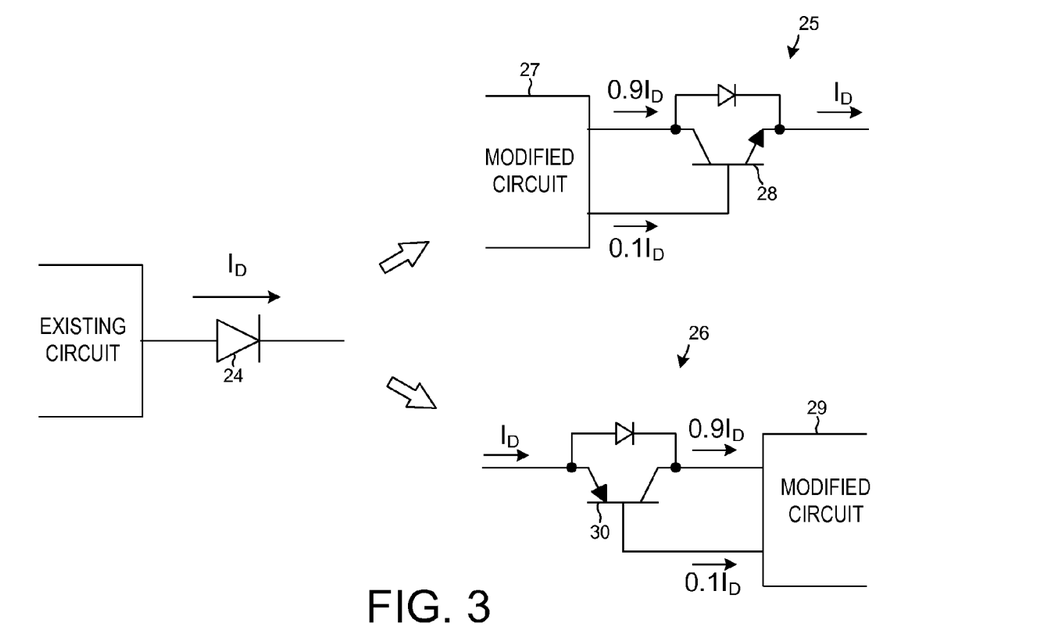
FIG. 3 is a diagram that illustrates how a diode in such a rectifier can be replaced with one of two bipolar transistor circuits.

FIG. 3 is a diagram that illustrates how a diode 24 in such a rectifier can be replaced with one of two bipolar transistor circuits 25 or 26. In order for the bipolar transistor to be turned on and to have the desired low forward voltage drop (low $V_{CE}$), a transistor must have a base current. In the case of circuit 25, the additional circuit 27 splits the incoming current $I_D$ such that about one tenth of the total current $I_D$ is supplied to the base of the NPN bipolar transistor 28. In the case of circuit 26, the additional circuit 29 draws a base current from the base of the PNP bipolar transistor 30, where the base current is about one tenth of the total current $I_D$.

Figure 4:
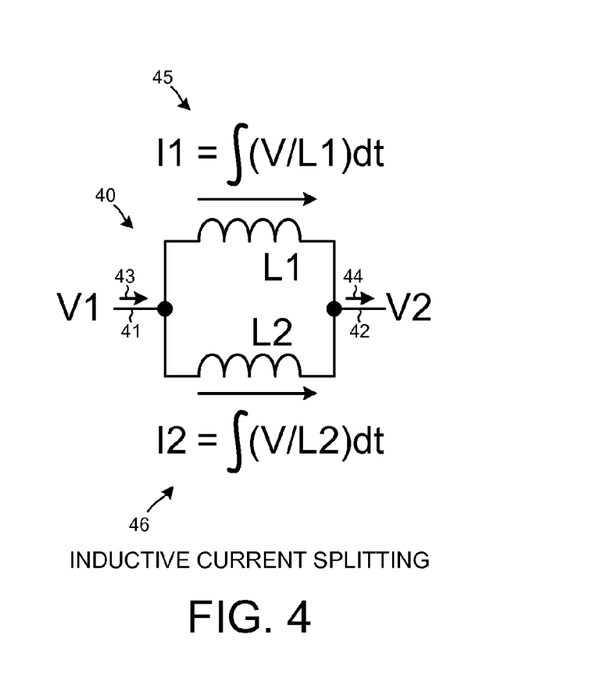
FIG. 4 is a diagram that illustrates an inductive current splitting circuit.

FIG. 4 is a diagram that illustrates an inductive current splitting circuit 40. The circuit includes two inductors L1 and L2. The leftmost terminals of inductors L1 and L2 are coupled together at node 41, and the rightmost terminals of inductors L1 and L2 are coupled together at node 42, so that the magnitudes of the incoming current 43 and of the outgoing current 44 are identical. What proportion of the current flows through one inductor as compared to the other inductor (I1 and I2) is given by the inductance values L1 and L2 as indicated by equations 45 and 46.

Figure 5:
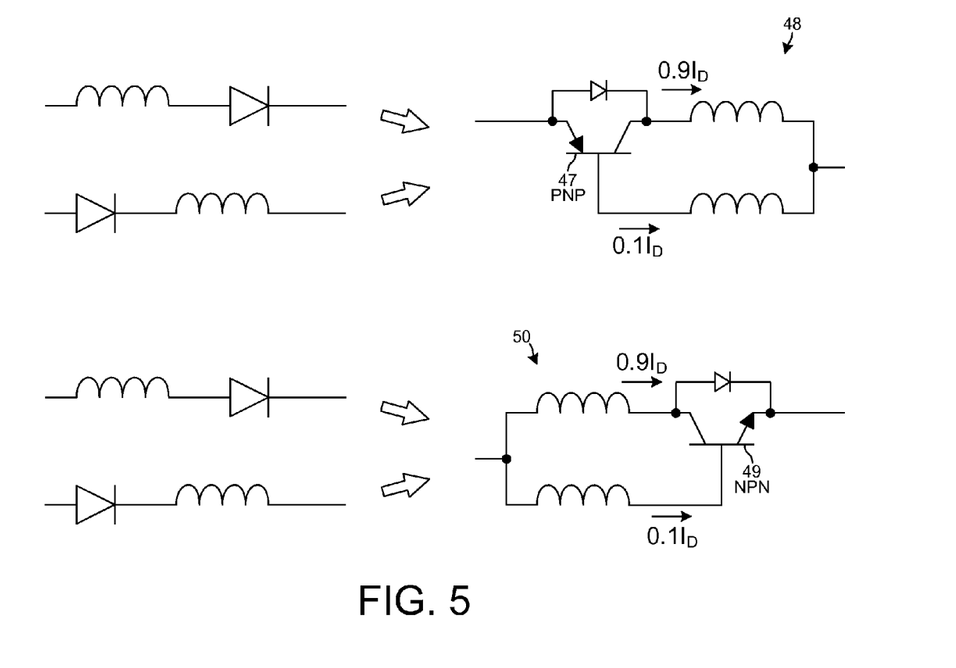
FIG. 5 is a diagram that shows how the inductive current splitting of FIG. 4 can be employed to perform the function of the "modified circuits" of FIG. 3.

FIG. 5 is a diagram that shows how the inductive current splitting of FIG. 4 can be employed to perform the function of the "additional circuits" 27 and 29 of FIG. 3. In the case of a PNP bipolar transistor 47, the inductive current splitting circuit 48 draws a current from the base of the bipolar transistor 47 that is roughly about one tenth of the overall current $I_D$. In the case of an NPN bipolar transistor 49, the inductive current splitting circuit 50 supplies a current to the base of the bipolar transistor 49 that is roughly about one tenth of the overall current $I_D$. The current splitting works because, in each circuit, the voltages across the two inductors of the current splitting circuit are roughly equal to one another.

Figure 6:
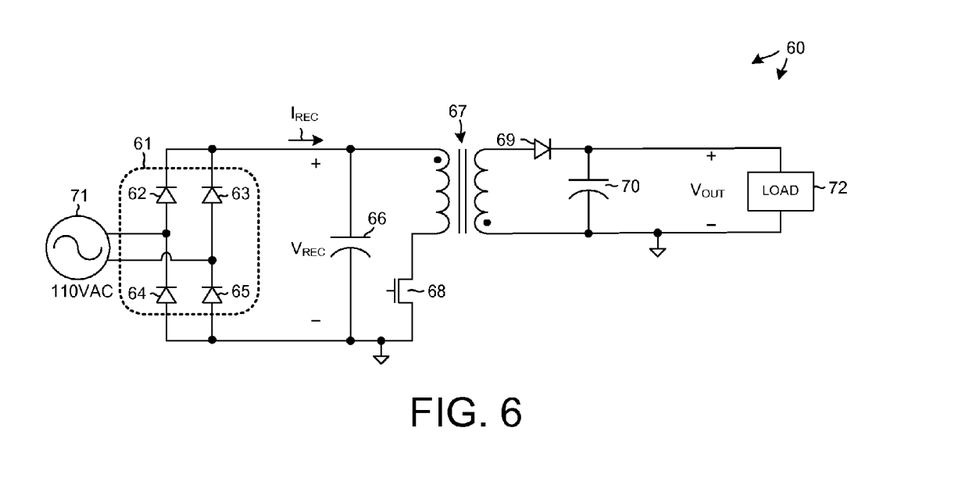
FIG. 6 is a simplified diagram of an AC-to-DC flyback converter that employs a full bridge rectifier.

FIG. 6 is a simplified diagram of an AC-to-DC flyback converter 60 that employs a full bridge rectifier 61. The circuit includes the four diodes 62, 63, 64 and 65 of the full bridge rectifier, an input storage capacitor 66, a transformer 67, a main switch 68, an output rectifying diode 69, and an output storage capacitor 70. The AC voltage supply 71 and the load 72 are not parts of the converter 60.

Figure 7:
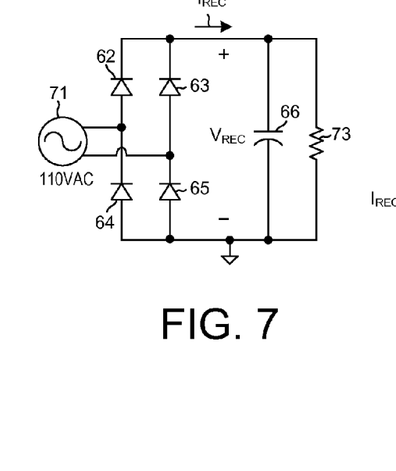
FIG. 7 is a simplified diagram of the rectifier portion of the AC-to-DC converter of FIG. 6.

FIG. 7 is a simplified diagram of the rectifier portion of the AC-to-DC converter 60 of FIG. 6. The resistor 73 simulates the load of everything in the converter 60 to the right of the input storage capacitor 66.

Figure 8:
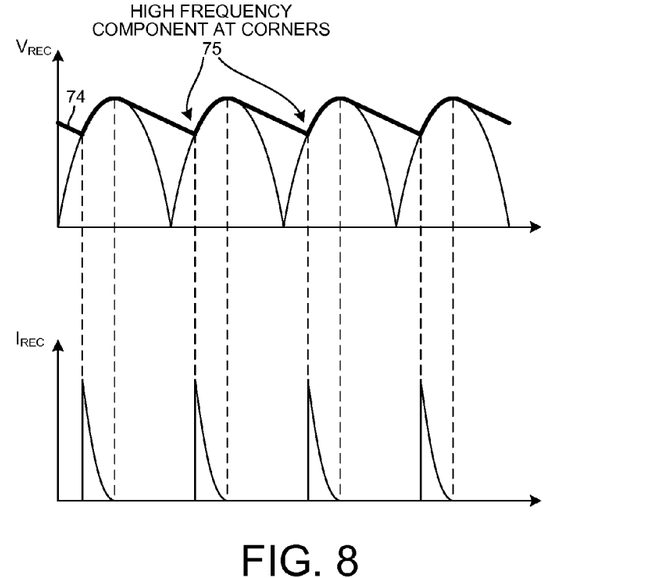
FIG. 8 is a simplified waveform diagram of an operation of the rectifier portion of FIG. 7.

FIG. 8 is a simplified waveform diagram of an operation of the rectifier portion of FIG. 7. Line 74 represents the rectified version of the input sinusoidal AC power supply voltage. $V_{REC}$ represents the voltage across the capacitor 66. After charging to a peak voltage, the supply voltage $V_{REC}$ decays during the remainder of the cycle due to the load until the next charging up to the peak voltage. The highest frequency component of the change in the voltage $V_{REC}$ occurs at the corners identified by reference numeral 75. The voltage and current relationships of a capacitor are given by I=CdV/dt. The current $I_{REC}$ waveform there has sharp peaks. The bursts of $I_{REC}$ current flows occur significantly before the peaks of the input supply voltage. To reduce these high frequency components, and to improve power factor, an inductance can be added.

Figures 9, 10:
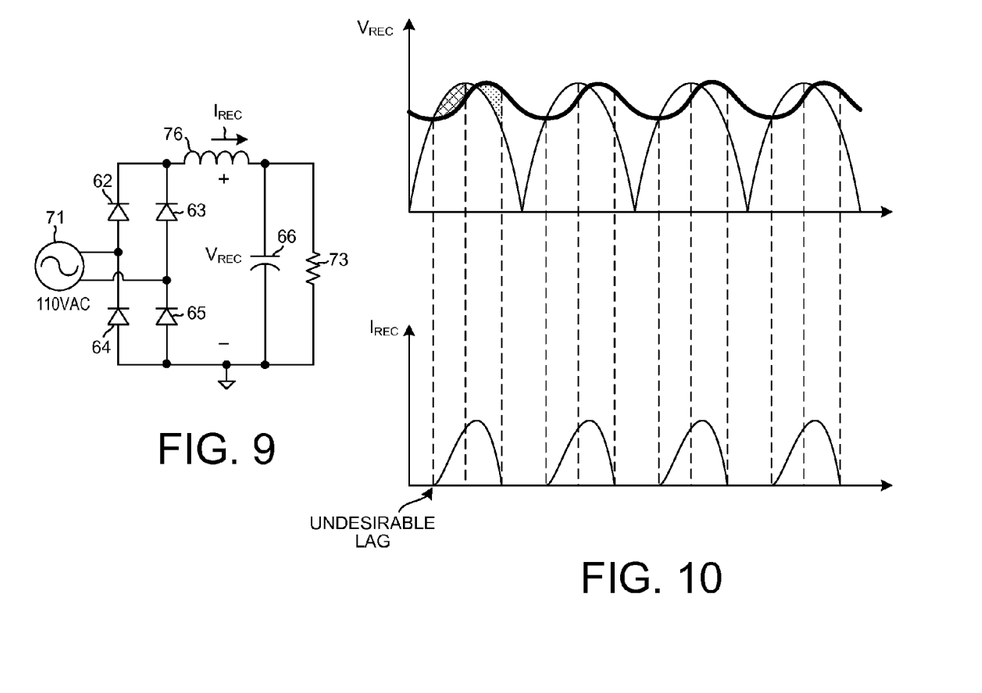
FIG. 9 is a diagram of the rectifier circuit of FIG. 7, with an inductor added.
FIG. 10 is a simplified waveform diagram of an operation of the circuit of FIG. 9.

FIG. 9 is a diagram of the rectifier circuit of FIG. 7, with an inductor 76 added.

FIG. 10 is a simplified waveform diagram of an operation of the circuit of FIG. 9. As compared to the waveform of voltage $V_{REC}$ in FIG. 8, the waveform of voltage $V_{REC}$ in FIG. 10 is smoother. The rapid changing of the voltage $V_{REC}$ at corners 75 in FIG. 8 is not seen in the waveform of voltage $V_{REC}$ in FIG. 10. The waveform of the current $I_{REC}$ is therefore smoother than the current $I_{REC}$ waveform in FIG. 7. The bumps of current $I_{REC}$ are behind, but only slightly, the peaks of the input supply voltage $V_{IN}$. The power factor of the input rectifying circuitry is therefore improved as compared to the power factor of the circuitry of FIG. 7. Also, the sharpness of the peaks of the current $I_{REC}$ in the waveform of FIG. 8 are not present in the smoother $I_{REC}$ waveform of FIG. 10. Accordingly, inductances are often added to the input rectifier portions of AC-to-DC converter circuits in order to reduce noise and to improve power factor. The inductor 76 of the converter of FIG. 9 is one place an inductor can be added.

Figure 11:
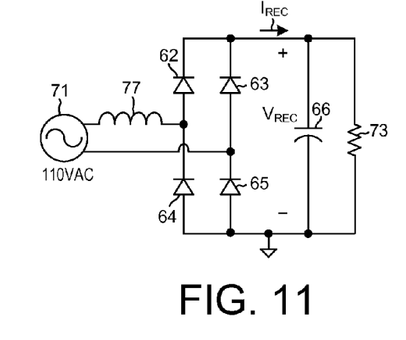
FIG. 11 is a diagram that shows another place an inductor can be added to improve power factor and to reduce noise.

FIG. 11 is a diagram that shows another place an inductor 77 can be added to improve power factor and to reduce noise. An inductor 77 is disposed between the AC voltage source 71 and the diodes 62, 63, 64 and 65 of the full bridge rectifier.

Figure 12:
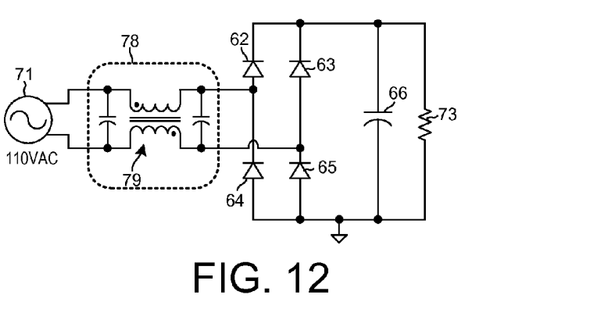
FIG. 12 is a diagram that shows another place that an inductance can be added to improve power factor and to reduce noise.

FIG. 12 is a diagram that shows another place that an inductance can be added to improve power factor and to reduce noise. The circuitry 78 is a noise filter that is commonly needed to satisfy noise requirements. The transformer 79 of the noise filter 78 provides an inductance that improves power factor and reduces noise.

If, in these circuits, a rectifier diode is in series with an inductor, then a substitution of FIG. 5 can be employed to replace the diode with a bipolar transistor. In the circuit of FIG. 9 the cathode of diode 62 is in series with inductor 76, but the cathode of diode 63 does not have a separate inductor in series with it. If, however, only one of the diodes in such a circuit is conducting current at a time, then the inductor can be replaced with two parallel inductors, where one diode is in series with one of the inductors, and the other diode is in series with the other of the inductors, and where the output terminals of the two inductors are connected together. This substitution can be made of diodes 62 and 63 and inductor 76 of the circuit of FIG. 9. In addition, an additional inductance can be placed in the return path between the output capacitor and the two return diodes 64 and 65. A similar substitution can also be made in the return path for the two bottom diodes 64 and 65.

Figure 13:
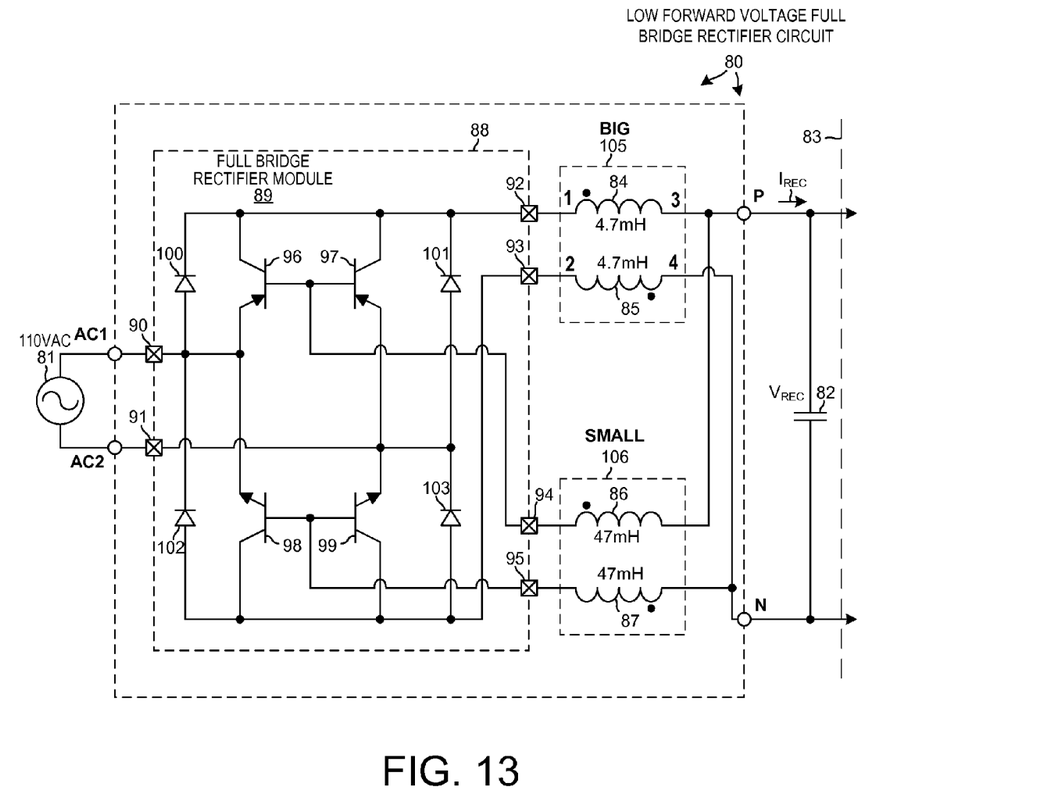
FIG. 13 is a diagram of the resulting low forward voltage full bridge rectifier circuit.

FIG. 13 is a diagram of the resulting low forward voltage full bridge rectifier circuit 80. The circuit 80 is shown with a 110VAC voltage source 81, and an input storage capacitor 82. The remainder of an AC-to-DC converter may be provided to the right of dashed line 83, and is not illustrated. Because the magnitude of the base current is much smaller than the magnitude of the collector current in a bipolar transistor that is on and operating at its operating current level as explained above in connection with FIG. 2, the inductances of inductors 84 and 85 are about one tenth the inductances of inductors 86 and 87.

Dashed line 88 represents the boundary of a six-terminal full bridge rectifier module 89. The module 89 includes six package terminals 90-95, four bipolar transistors 96-99, and four diodes 100-103, interconnected as shown. Transistor 96 and diode 100 are parts of a first semiconductor die. Transistor 97 and diode 101 are parts of a second semiconductor die. Transistor 98 and diode 102 are parts of a third semiconductor die. Transistor 99 and diode 103 are parts of a fourth semiconductor die. The bipolar transistors have an unusually high reverse breakdown voltage adequate for the application, which in this case is a reverse breakdown voltage of about 200 volts. An amount of encapsulant encapsulates the bipolar transistors 96-99 and the diodes 100-103 such that the package terminals extend out of the encapsulant. The six-terminal full bridge rectifier module 89 has the appearance of a six-terminal packaged integrated circuit. Dashed line 105 represents a first inductor component, that includes the two inductors 84 and 85. Dashed line 106 represents a second inductor component, that includes the two inductors 86 and 87.

Figure 14:
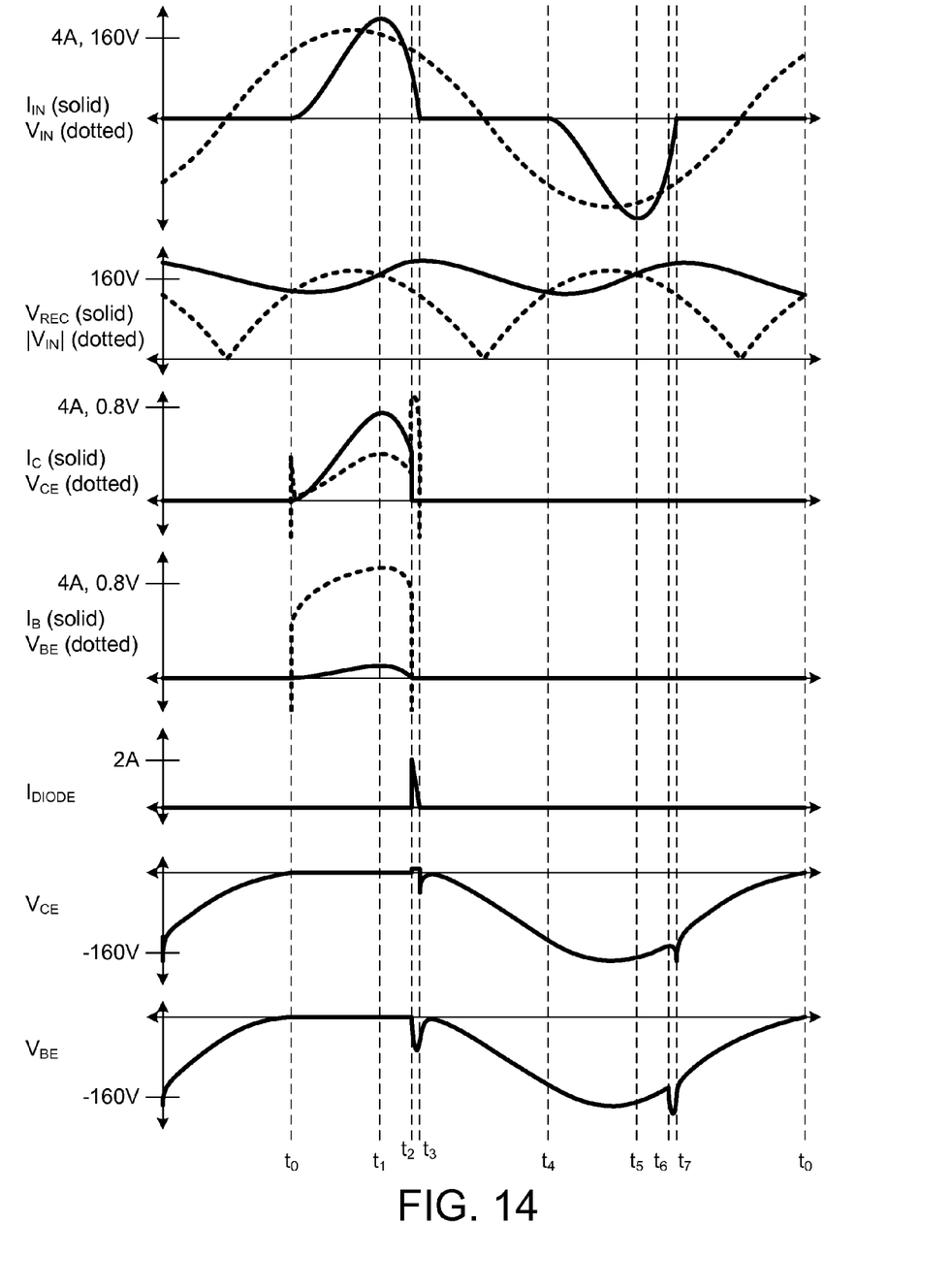
FIG. 14 is a waveform diagram of an operation of the circuit of FIG. 13.

FIG. 14 is a waveform diagram of an operation of the circuit of FIG. 13. Waveform $V_{IN}$ is a waveform showing one cycle of the incoming 110 VAC 60 Hz sinusoidal wave of the input power supply voltage. The $V_{IN}$ supply voltage is 110 VAC supply voltage, so its peak voltage is about 155 volts as shown. Waveform $I_{IN}$ shows the incoming current. Waveform $V_{REC}$ is the output voltage across capacitor 82. Waveform $V_{CE}$ shows the voltage across one of the rectifying bipolar transistors. From time $t_0$ to time $t_2$, the bipolar transistor is conducting and yet the voltage drop across the rectifying bipolar transistor is about 0.4 volts at its maximum. At the end of the conduction cycle, at time $t_2$, the current splitting inductor circuit stops supplying the base current to the bipolar transistor a little too early before the collector current $I_C$ has stopped flowing. Accordingly, the transistor starts to turn off and the voltage across the bipolar transistor increases. But when the voltage reaches about 0.8 volts, the parallel diode 100 conducts. The magnitude of the voltage of the bipolar transistor/diode rectifier is therefore limited to be about one volt. This time when the parallel diode 100 conducts is only of a very short duration. At time $t_3$ the diode stops conducting. The current flow through the rectifying bipolar transistor/diode ceases altogether, and stays at zero until the next cycle of the input supply voltage $V_{IN}$. As compared to a conventional full bridge rectifier involving diodes as the rectifying elements (that has a forward voltage drop of about 2.0 volts), the circuit of FIG. 13 has a smaller maximum forward voltage drop (about 0.8 volts). This represents a sixty percent reduction in energy loss in the full bridge rectifier.

Figure 15:
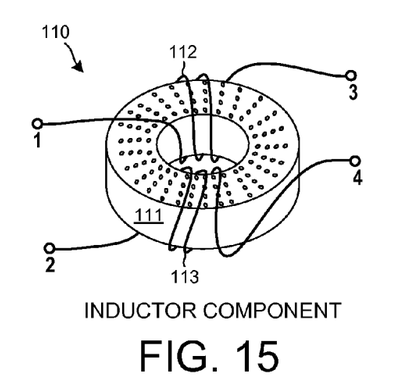
FIG. 15 is a diagram of one way that the inductors of the circuit of FIG. 13 can be made.

FIG. 15 is a diagram of one way that the inductors 105 and 106 of the circuit of FIG. 13 can be made. The inductor component 110 has a toroidal core 111, with a distributed air gap material. The two inductors 105 and 106 are realized from the one component 110 by virtue of the two windings 112 and 113 shown. The terminal leads 1, 2, 3, and 4 of FIG. 15 correspond to the terminals leads 1, 2, 3, and 4 in the circuit of FIG. 13.

Figure 16:
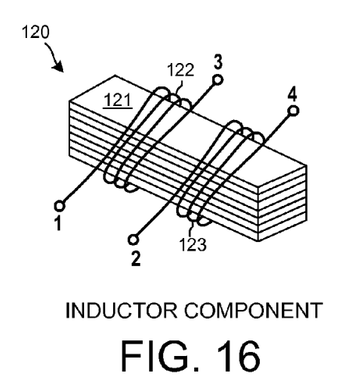
FIG. 16 is a diagram of a second way that the inductors of the circuit of FIG. 13 can be made.

FIG. 16 is a diagram of a second way that the inductors 105 and 106 of the circuit of FIG. 13 can be made. The inductor component 120 has a bar-shaped core 121. The core material 121 involves a sandwich of steel plates and insulation layers. The two inductors 105 and 106 are realized from one component 120 by virtue of the two windings 122 and 123 shown. The terminal leads 1, 2, 3, and 4 of FIG. 16 correspond to the terminals leads 1, 2, 3 and 4 in the circuit of FIG. 13.

Figure 17:
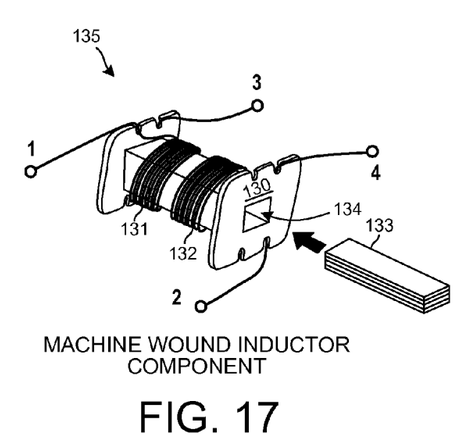
FIG. 17 is a diagram of a third way that the inductors of the circuit of FIG. 13 can be made.

FIG. 17 is a diagram of a third way that the inductors 105 and 106 of the circuit of FIG. 13 can be made. Two lengths of wire are machine wound around a plastic bobbin 130 to form two windings 131 and 132. The two inductors 105 and 106 are realized from the one component 135 by virtue of the two windings. A core such as the bar-shaped core 133 of FIG. 17, is then slid into the central axial opening 134 of the bobbin, thereby forming the inductor component 135. The terminal leads 1, 2, 3, and 4 of FIG. 17 correspond to the terminals leads 1, 2, 3, and 4 in the circuit of FIG. 13.

Figure 18:
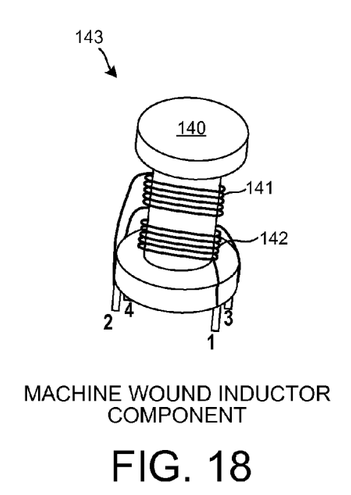
FIG. 18 is a diagram of a fourth way that the inductors of the circuit of FIG. 13 can be made.

FIG. 18 is a diagram of a fourth way that the inductors 105 and 106 of the circuit of FIG. 13 can be made. Two lengths of wire are machine wound around a ferrite core 140 to form two windings 141 and 142. The two inductors 105 and 106 are realized from one component 143 by virtue of the two windings. The wires can extend downward beyond the bottom of the core to make a leaded inductor component 143. Alternatively the core 140 has metalized tabs, each of which extends along the side and also the bottom surface of the core. The ends of the leads are shorter and are attached to corresponding ones of the metalized tabs on the side of the bottom of the ferrite core so as to form the surface mountable inductor component 143.

Figure 19:
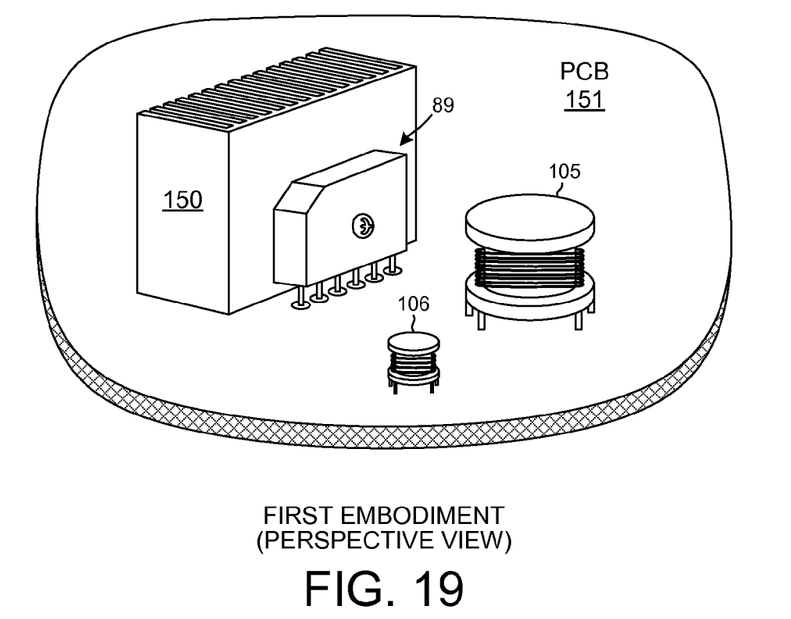
FIG. 19 is a perspective diagram of a first embodiment of the low forward voltage full bridge rectifier circuit of FIG. 13.

FIG. 19 is a perspective diagram of a first embodiment of the low forward voltage full bridge rectifier circuit 89 of FIG. 13. The six-terminal full bridge LFV rectifier module 89 has the form of a single in-line package. The six-terminal in-line package is coupled to a heatsink 150 as illustrated. The first and second inductor components 105 and 106 of the circuit of FIG. 13 are of the leaded form, and are disposed outside the module package and on the printed circuit board 151.

Figure 20:
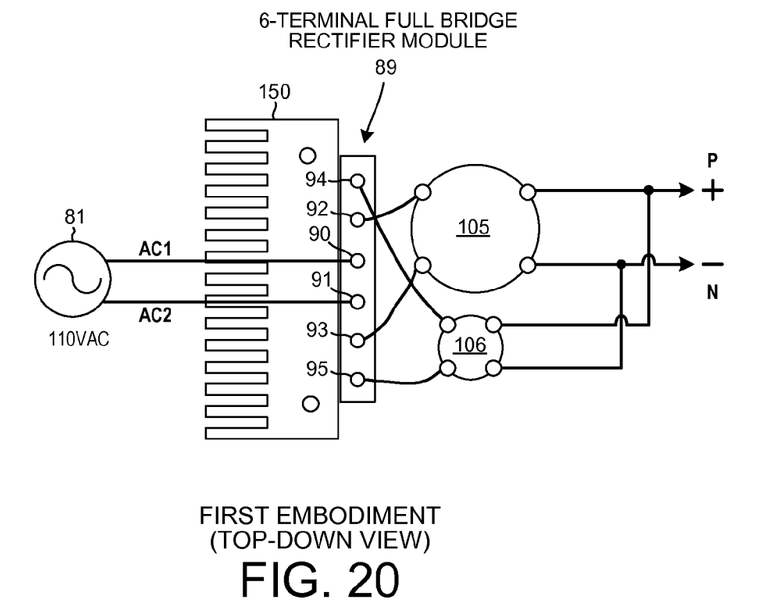
FIG. 20 is a schematic diagram that illustrates interconnectivity of the printed circuit board.

FIG. 20 is a schematic diagram that illustrates interconnectivity of the printed circuit board 151 of FIG. 19. The AC voltage source 81 is coupled to the AC1 and AC2 input package terminals of module 89, and the other four package terminals of the module are connected to the inductor components 105 and 106 as illustrated.

Figure 21:
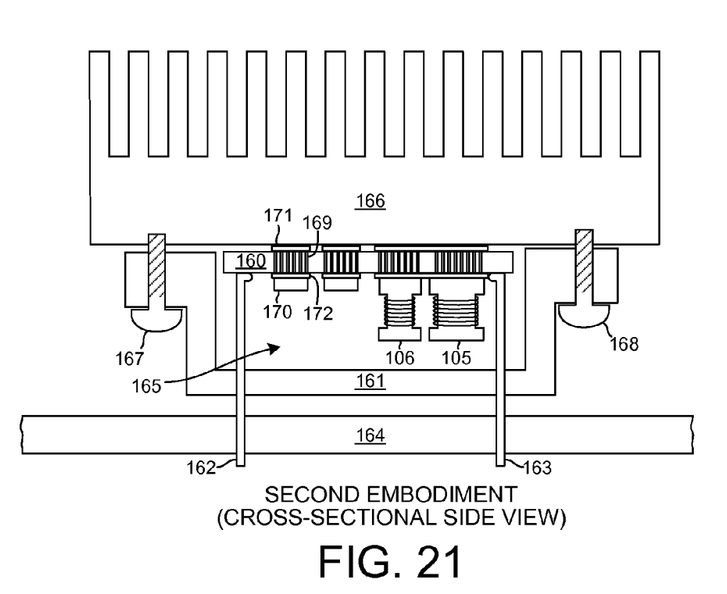
FIG. 21 is a cross-sectional side view of a second embodiment of the circuit of FIG. 13.

FIG. 21 is a cross-sectional side view of a second embodiment of the circuit of FIG. 13. The circuitry of FIG. 13 including the inductor components 105 and 106 is realized on a small Printed Circuit Board (PCB) 160. Four package pins are provided that extend from the PCB 160 and out of accommodating holes in the plastic housing cap 161. Reference numerals 162 and 163 identify two of the four package pins. The plastic housing cap 161 is an injection molded object that has a cup shape. The cup shape, together with the PCB 160, forms an enclosure that encloses the electrical components on the face side of PCB 160. Each of the four package pins has a substantial foot portion that is securely soldered to PCB 160. In an assembly, the opposite end of each pin is made to extend through a corresponding hole in a second PCB 164. The second PCB 164 is the main PCB upon which the components of the remainder of the AC-to-DC converter are disposed. PCB 160, on the other hand, is part of the module package involving plastic housing cap 161, the components and package pins. The volume 165 within the module package is filled with gel to prevent arching inside the module. A heatsink 166 is attached to the module package via screws 167 and 168 as illustrated. To facilitate heat conduction from the semiconductor dice in the module to the heatsink, each area of the PCB 160 directly underneath a semiconductor die is provided with multiple tightly spaced plated through holes. Reference numeral 169 identifies one such plated through hole, and reference numeral 170 identifies one of the semiconductor dice. A metal plate 171 is disposed on one surface of the PCB, and a second metal plate 172 is disposed on the opposite surface of the PCB. The many heat-conducting plated through holes connect these two plates together thermally, thereby proving better thermal conduction between the semiconductor dice and the heatsink. The resulting four-terminal module is a drop-in replacement for a conventional four-terminal full bridge rectifier.

Figure 22:
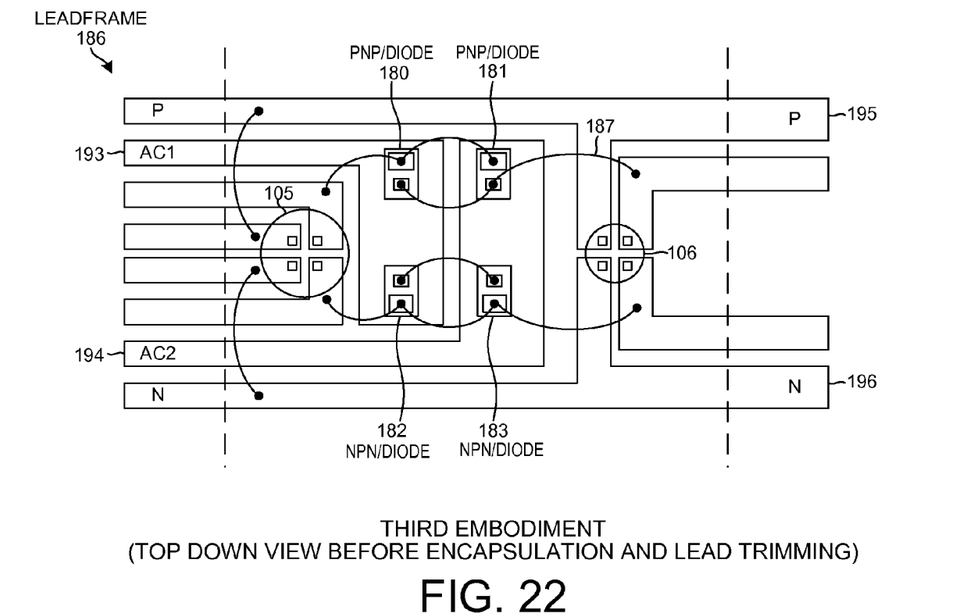
FIG. 22 is a top-down diagram of an intermediate step in the manufacture of a third embodiment of the circuit of FIG. 13.

FIG. 22 is a top-down diagram of an intermediate step in the manufacture of a third embodiment of the circuit of FIG. 13. Four semiconductor dice 180, 181, 182, and 183 and the two inductor components 105 and 106 are surface mounted down onto a leadframe 186. The leadframe 186 is shown in simplified form in FIG. 22 without the end rails, and only one package component portion of the leadframe is shown. Each of the semiconductor dice 180-183 of FIG. 22 includes a bipolar transistor and a parallel diode. The bottom surface of the die is a metal emitter terminal. A base bond pad and a collector bond pad are disposed on the top of the die. Dice 180 and 181 include PNP bipolar transistors with parallel diodes. Dice 182 and 183 include NPN bipolar transistors with parallel diodes. There are ten wire bonds as shown. Reference numeral 187 identifies one of the ten wire bonds. Each of the two inductor components 105 and 106 has four surface mount pads that make electrical contact down to four corresponding lead portions of the leadframe as shown. After the attachment and wire bonding of these components to the leadframe, an injection molding step is performed so that the dice 180-183 and the inductor components 105 and 106 are encapsulated. Lead trimming and lead forming steps are then performed.

Figure 23:
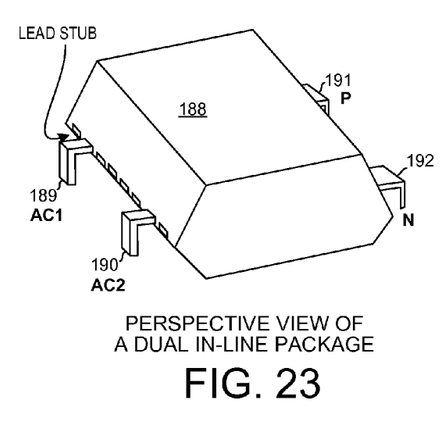
FIG. 23 is a perspective view of the resulting packaged device in one example.

FIG. 23 is a perspective view of the resulting dual in-line packaged device 188 in one example. Only two leads 189 and 190 are left to extend from the near side of the packaged device, and only two leads 191 and 192 are left to extend from the opposite side of the packaged device. The other leads are trimmed off in the lead trimming step. Only stubs of these leads are left. AC1 lead 193 of the leadframe becomes AC1 lead 189 of the packaged device. AC2 lead 194 of the leadframe becomes AC2 lead 190 of the packaged device. P lead 195 of the leadframe becomes P lead 191 of the packaged device. N lead 196 of the leadframe becomes N lead 192 of the packaged device.

Figure 24:
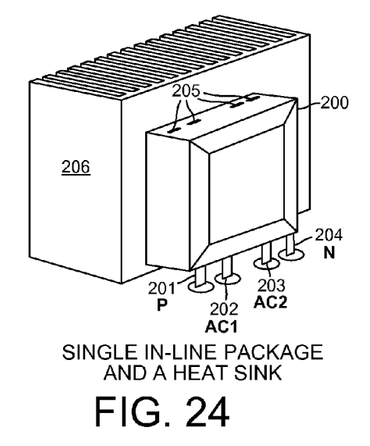
FIG. 24 is a perspective view of the resulting packaged device in another example.

FIG. 24 is a perspective view of the resulting single in-line packaged device 200 in another example. Four leads P 201, AC1 202, AC2 203, and N 204 are left extending from one side of the packaged device so that a single in-line package 200 is produced. Lead P 201 of FIG. 24 is the lead that remains from lead P 195 of the leadframe of FIG. 22. AC1 lead 202 of FIG. 24 is the lead that remains from lead AC1 193 of the leadframe of FIG. 22. Lead AC2 203 of FIG. 24 is the lead that remains from lead AC2 194 of the leadframe of FIG. 22. Lead N 204 of FIG. 24 is the lead that remains from lead N 196 of the leadframe of FIG. 22. All parts of the leadframe that otherwise would extend from the other side of the packaged device are trimmed off. Stubs 205 are the remnants of these leads.

Figure 25:
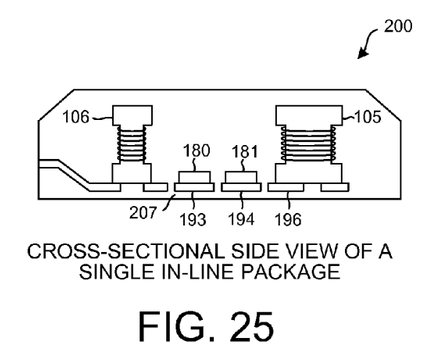
FIG. 25 is a cross-sectional side view of the single-in line packaged device of FIG. 24.

FIG. 25 is a cross-sectional side view of the single-in line packaged device 200 of FIG. 24. No package terminal is shown extending from the left side of the package in FIG. 25 because in the particular cross section of FIG. 25 the left-extending lead in this cross-section was trimmed, and therefore only remains as a stub. In one example, metal of the leadframe is left exposed on the bottom of the package. When the packaged device is used, a thin thermally conducting but insulating pad is disposed between the metal on the bottom side of the packaged device and the metal of a heatsink 206 to which the packaged device 200 is attached. Alternatively, a very thin amount 207 of plastic encapsulant is disposed underneath the metal of the leadframe so that there is no exposed metal on the bottom of the packaged device. In this case, heat conduction occurs through the thin plastic layer 207. The thin plastic provides the necessary electrical insulation between the metal of the leadframe in the packaged device and the heatsink, so no extra thermally conductive but insulating pad is provided between the packaged device 200 and the heatsink.

Figure 26:
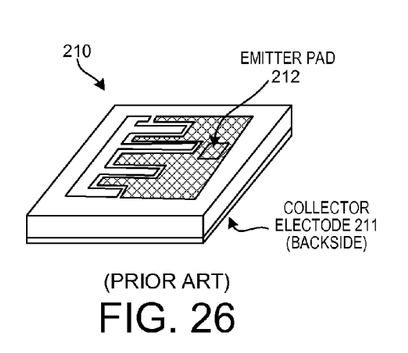
FIG. 26 (Prior Art) is a perspective diagram of a conventional bipolar transistor die.

FIG. 26 (Prior Art) is a perspective diagram of a conventional bipolar transistor die 210. The collector electrode 211 is on the bottom of the die. Emitter current flows a substantial distance from the emitter pad 212 to the end of an emitter finger. Current flow through such a narrow finger involves a voltage drop across the resistance of the finger.

Figure 27:
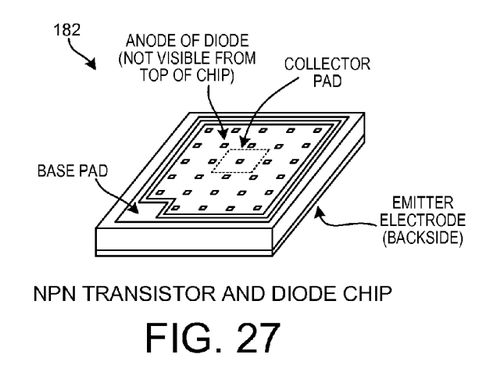
FIG. 27 is a perspective diagram of die that is mounted on the leadframe of FIG. 22.

FIG. 27 is a perspective diagram of die 182 that is mounted on the leadframe of FIG. 22. Die 183 also includes an NPN transistor and is of identical construction to die 182. Die 182 includes both an NPN bipolar transistor and a parallel diode. The anode of the diode is coupled to the collector of the NPN bipolar transistor. The emitter electrode of the bipolar transistor is on the bottom of the die. The base electrode is not a fingered electrode structure such as is shown in FIG. 25, but rather is a mesh structure. Metal from an underlying collector electrode extends up through openings in the base electrode mesh to form island-like structures as illustrated. Dice 180-181 that include PNP transistors and parallel diodes are of similar construction, except that in the case of a PNP transistor the cathode of the diode is coupled to the collector of the transistor. For further details on the construction and composition of the dice 180-183, see: U.S. patent application Ser. No. 13/299,340, entitled "Bipolar Junction Transistor For Current Driven Synchronous Rectifier," filed on Nov. 17, 2011, now U.S. Pat. No. 8,648,399 (the entire subject matter of which is expressly incorporated by reference herein).

Figure 28:
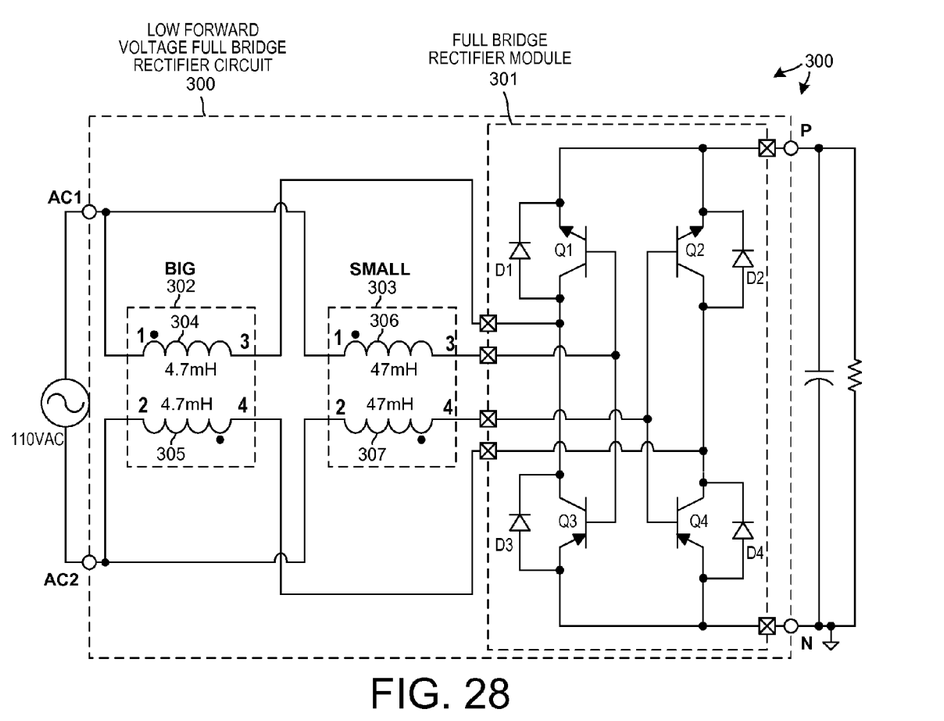
FIG. 28 is a diagram of a fourth embodiment of a low forward voltage full bridge rectifier circuit.

FIG. 28 is a diagram of a fourth embodiment of a low forward voltage full bridge rectifier circuit 300. The circuit 300 includes a six-terminal full bridge rectifier module 301 and inductor components 302 and 303. Inductor component 302 includes two inductors 304 and 305. Inductor component 303 includes two inductors 306 and 307. In the embodiment of FIG. 28, the four inductors are disposed between the AC input voltage source and the bipolar transistor rectifier portion of the circuit, whereas in the embodiment of FIG. 13 the four inductors are disposed between the bipolar rectifier portion of the circuit and the P and N output terminals.

Figure 29:
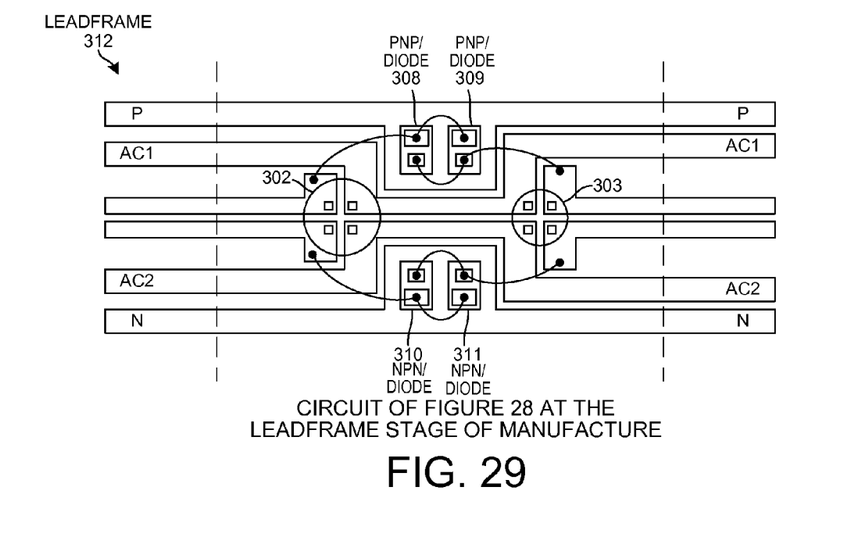
FIG. 29 is a top-down diagram of an intermediate step in the manufacture of the fourth embodiment of FIG. 28.

FIG. 29 is a top-down diagram of an intermediate step in the manufacture of one example of the fourth embodiment of FIG. 28. In this example there is no separate six-terminal full bridge rectifier module, but rather the four semiconductor dice 308, 309, 310, and 311 and the two inductor components 302 and 303 are surface mounted down onto a leadframe 312. After wire bonding, encapsulation, lead trimming, and lead forming, either a four-terminal in-line or a four-terminal dual in-line packaged low forward voltage full bridge rectifier circuit is realized. As in the case of the third embodiment of FIG. 22, the inductor components are injection molded along with the four dice in the embodiment of FIG. 29.

Although certain specific embodiments are described above for instructional purposes, the teachings of this patent document have general applicability and are not limited to the specific embodiments described above. The circuits of FIG. 13 and FIG. 38 can be realized using discrete parts at the printed circuit board level without integration or modularization of any of the components. Accordingly, various modifications, adaptations, and combinations of various features of the described embodiments can be practiced without departing from the scope of the invention as set forth in the claims.

What is claimed is:

1. A packaged semiconductor device, comprising:
   a first package terminal;
   a second package terminal;
   a third package terminal;
   a fourth package terminal;
   a fifth package terminal;
   a sixth package terminal;
   a first bipolar transistor BJT1 having an emitter coupled to the first package terminal, having a collector coupled to the third package terminal, and having a base directly coupled to the fifth package terminal;
   a second bipolar transistor BJT2 having an emitter coupled to the second package terminal, having a collector coupled to the third package terminal, and having a base directly coupled to the fifth package terminal;
   a third bipolar transistor BJT3 having an emitter coupled to the first package terminal, having a collector coupled to the fourth package terminal, and having a base directly coupled to the sixth package terminal;
   a fourth bipolar transistor BJT4 having an emitter coupled to the second package terminal, having a collector coupled to the fourth package terminal, and having a base directly coupled to the sixth package terminal;
   a first diode D1 having an anode coupled to the emitter of BJT1 and having a cathode coupled to the collector of BJT1;
   a second diode D2 having an anode coupled to the emitter of BJT2 and having a cathode coupled to the collector of BJT2;
   a third diode D3 having an anode coupled to the collector of BJT3 and having a cathode coupled to the emitter of BJT3; and
   a fourth diode D4 having an anode coupled to the collector of BJT4 and having a cathode coupled to the emitter of BJT4.

2. The packaged semiconductor device of claim 1, further comprising:
   an amount of encapsulant that encapsulates BJT1, BJT2, BJT3, BJT4, D1, D2, D3, and D4 within the packaged semiconductor device.

3. The packaged semiconductor device of claim 1, wherein BJT1 is a part of a semiconductor die, wherein the semiconductor die has a backside, wherein the first package terminal is a metal member, and wherein the backside of the semiconductor die is attached to the metal member.

4. The packaged semiconductor device of claim 3, wherein D1 is a part of the semiconductor die.

5. The packaged semiconductor device of claim 1, wherein BJT1 has a reverse breakdown voltage greater than about one hundred and fifty volts.

6. The packaged semiconductor device of claim 1, wherein BJT1 and D1 are parts of a first semiconductor die, wherein BJT2 and D2 are parts of a second semiconductor die, wherein BJT3 and D3 are parts of a third semiconductor die, and wherein BJT4 and D4 are parts of a fourth semiconductor die.

7. A packaged semiconductor device comprising:
   a first package terminal;
   a second package terminal;
   a third package terminal;
   a fourth package terminal;
   a first bipolar transistor BJT1 having a first terminal, a second terminal, and a third terminal, wherein the first terminal of BJT1 is coupled to the first package terminal;
   a second bipolar transistor BJT2 having a first terminal, a second terminal, and a third terminal, wherein the first terminal of BJT2 is coupled to the second package terminal;
   a third bipolar transistor BJT3 having a first terminal, a second terminal, and a third terminal, wherein the first terminal of BJT3 is coupled to the first package terminal; and
   a fourth bipolar transistor BJT4 having a first terminal, a second terminal, and a third terminal, wherein the first terminal of BJT4 is coupled to the second package terminal;
   a first inductor I1 having a first terminal and a second terminal, wherein the first terminal of I1 is coupled to the second terminal of BJT1 and to the second terminal of BJT2, and wherein the second terminal of I1 is coupled to the third package terminal;
   a second inductor I2 having a first terminal and a second terminal, wherein the first terminal of I2 is coupled to the second terminal of BJT3 and to the second terminal of BJT4, and wherein the second terminal of I2 is coupled to the fourth package terminal;
   a third inductor I3 having a first terminal and a second terminal, wherein the first terminal of I3 is coupled to the third terminal of BJT1 and to the third terminal of BJT2, and wherein the second terminal of I3 is coupled to the third package terminal; and Pa fourth inductor I4 having a first terminal and a second terminal, wherein the first terminal of I4 is coupled to the third terminal of BJT3 and to the third terminal of BJT4, and wherein the second terminal of I4 is coupled to the fourth package terminal. P8. A packaged semiconductor device comprising: Pa first package terminal; Pa second package terminal; Pa third package terminal; Pa fourth package terminal; Pa first bipolar transistor BJT1 having a first terminal, a second terminal, and a third terminal, wherein the first terminal of BJT1 is coupled to the first package terminal; Pa second bipolar transistor BJT2 having a first terminal, a second terminal, and a third terminal, wherein the first terminal of BJT2 is coupled to the second package terminal; Pa third bipolar transistor BJT3 having a first terminal, a second terminal, and a third terminal, wherein the first terminal of BJT3 is coupled to the first package terminal; and Pa fourth bipolar transistor BJT4 having a first terminal, a second terminal, and a third terminal, wherein the first terminal of BJT4 is coupled to the second package terminal; Pa first inductor I1 having a first terminal and a second terminal, wherein the first terminal of I1 is coupled to the second terminal of BJT1 and to the second terminal of BJT2, and wherein the second terminal of I1 is coupled to the third package terminal; Pa second inductor I2 having a first terminal and a second terminal, wherein the first terminal of I2 is coupled to the second terminal of BJT3 and to the second terminal of BJT4, and wherein the second terminal of I2 is coupled to the fourth package terminal; Pa third inductor I3 having a first terminal and a second terminal, wherein the first terminal of I3 is coupled to the third terminal of BJT1 and to the third terminal of BJT2, and wherein the second terminal of I3 is coupled to the third package terminal; and Pa fourth inductor I4 having a first terminal and a second terminal, wherein the first terminal of I4 is coupled to the third terminal of BJT3 and to the third terminal of BJT4, wherein the second terminal of I4 is coupled to the fourth package terminal, and wherein I1 and I2 have inductances, wherein I3 and I4 have inductances, and wherein the inductances of I1 and I2 are less than half as large as the inductances of I3 and I4. P9. The packaged semiconductor device of claim 8, further comprising: Pa first diode D1 having an anode coupled to the first terminal of BJT1 and having a cathode coupled to the second terminal of BJT1; Pa second diode D2 having an anode coupled to the first terminal of BJT2 and having a cathode coupled to the second terminal of BJT2; Pa third diode D3 having an anode coupled to the second terminal of BJT3 and having a cathode coupled to the first terminal of BJT3; and Pa fourth diode D4 having an anode coupled to the second terminal of BJT4 and having a cathode coupled to the first terminal of BJT4. P10. The packaged semiconductor device of claim 9, further comprising: Pan amount of encapsulant that encapsulates I1, I2, I3, I4, BJT1, BJT2, BJT3, BJT4, D1, D2, D3 and D4 within the packaged semiconductor device. P11. The packaged semiconductor device of claim 10, wherein the first package terminal, the second package terminal, the third package terminal, and the fourth package terminal extend from the amount of encapsulant in-line in a single row. P12. The packaged semiconductor device of claim 10, wherein the first package terminal and the second package terminal extend from a first side of the amount of encapsulant, and wherein the third package terminal and the fourth package terminal extend from a second side of the amount of encapsulant. P13. The packaged semiconductor device of claim 8, wherein BJT1 is a part of a semiconductor die, wherein the semiconductor die has a backside, wherein the first package terminal is a metal member, and wherein the backside of the semiconductor die is attached to the metal member. P14. The packaged semiconductor device of claim 8, wherein I1 and I2 are parts of a first surface mount inductor component, wherein I3 and I4 are parts of a second surface mount inductor component, and wherein the bipolar transistors have reverse breakdown voltages greater than about one hundred and fifty five volts. P15. An electronic device comprising: Pa first pair of bipolar transistors, wherein each of the first pair of bipolar transistors is of a first type, wherein each of the first pair of bipolar transistors is coupled to an associated parallel diode, wherein each base of the first pair of bipolar transistors is coupled to a first inductance via a fifth package terminal, wherein each collector of the first pair of bipolar transistors is coupled to a second inductance via a third package terminal, and wherein the second inductance is smaller than the first inductance; and Pa second pair of bipolar transistors, wherein each of the second pair of bipolar transistors is of a second type, wherein the second type is different from the first type, wherein each of the second pair of bipolar transistors is coupled to an associated parallel diode, wherein each base of the second pair of bipolar transistors is coupled to a third inductance via a sixth package terminal, wherein each collector of the second pair of bipolar transistors is coupled to a fourth inductance via a fourth package terminal, and wherein the fourth inductance is smaller than the third inductance. P16. The electronic device of claim 15, wherein the first type is a PNP type bipolar transistor, and wherein the second type is an NPN type bipolar transistor. P17. The electronic device of claim 15, wherein an emitter of one of the first pair of bipolar transistors is coupled to a first package terminal, wherein an emitter of one of the second pair of bipolar transistors is coupled to a second package terminal, and wherein the first and second package terminals are supply terminals. P18. The electronic device of claim 15, wherein the first and third inductances are substantially equivalent, wherein the second and fourth inductances are substantially equivalent, and wherein the first inductance is about ten times the second inductance. P19. The electronic device of claim 15, wherein the first package terminal, second package terminal, third package terminal, fourth package terminal, fifth package terminal, and sixth package terminal extend from a side of a package. P20. The electronic device of claim 15, wherein one of the first pair of bipolar transistors and associated diode are parts of a semiconductor die, and wherein the one of the first pair of bipolar transistors has a reverse breakdown voltage greater than one hundred and fifty volts.

\* \* \* \* \*